United States Patent
Bozorg et al.

(10) Patent No.: US 10,862,423 B2
(45) Date of Patent: Dec. 8, 2020

(54) MULTI-STAGE SUB-THZ FREQUENCY GENERATOR INCORPORATING INJECTION LOCKING

(71) Applicant: University College Dublin, Dublin (IE)

(72) Inventors: Amirhossein Ansari Bozorg, Dublin (IE); Robert Bogdan Staszewski, Dublin (IE)

(73) Assignee: UNIVERSITY COLLEGE DUBLIN, Dublin (IE)

( * ) Notice: Subject to any disclaimer, the term of this patent is extended or adjusted under 35 U.S.C. 154(b) by 107 days.

(21) Appl. No.: 16/256,231

(22) Filed: Jan. 24, 2019

(65) Prior Publication Data

US 2019/0229675 A1 Jul. 25, 2019

Related U.S. Application Data

(60) Provisional application No. 62/621,611, filed on Jan. 25, 2018.

(51) Int. Cl.
*H03B 5/06* (2006.01)
*H03L 7/099* (2006.01)
(Continued)

(52) U.S. Cl.
CPC ............. *H03B 5/06* (2013.01); *H03B 5/1206* (2013.01); *H03B 5/1212* (2013.01);
(Continued)

(58) Field of Classification Search
CPC ...... H03B 5/1206; H03B 5/1237; H03B 5/06; H03B 5/1228; H03B 5/1212;
(Continued)

(56) References Cited

U.S. PATENT DOCUMENTS 6,580,330 B1   6/2003   Katznelson et al.
6,995,846 B2   2/2006   Kalayeh et al.
(Continued)

OTHER PUBLICATIONS

Lee, K., et al., "A 10MHz-BW, 5.6mW, 70dB SNDR ΔΣ ADC using VCO-based integrators with intrinsic DEM", IEEE International Symposium on Circuits and Systems (ISCAS), pp. 2006-2009, May 31, 2013.
(Continued)

*Primary Examiner* — Arnold M Kinkead
(74) *Attorney, Agent, or Firm* — Zaretsky Group PC; Howard Zaretsky

(57) ABSTRACT

A novel and useful mm-wave frequency generation system is disclosed that takes advantage of injection locking techniques to generate an output oscillator signal with improved phase noise (PN) performance and power efficiency. Low frequency and high frequency DCOs as well as a pulse generator make up the oscillator system. A fundamental low frequency (e.g., 30 GHz) signal and its sufficiently strong higher (e.g., fifth) harmonic (e.g., 150 GHz) are generated simultaneously in a single oscillator system. The second high frequency DCO having normally poor phase noise is injected locked to the first low frequency DCO having good phase noise. Due to injection locking, the high frequency output signal generated by the second DCO exhibits good phase noise since the phase noise of the second DCO tracks that of the first DCO.

20 Claims, 15 Drawing Sheets

(51) Int. Cl.
  *H03B 5/12* (2006.01)
  *H04L 27/227* (2006.01)
  *H03L 1/02* (2006.01)
  *H03L 7/24* (2006.01)

(52) U.S. Cl.
  CPC ......... *H03B 5/1218* (2013.01); *H03B 5/1228* (2013.01); *H03B 5/1237* (2013.01); *H03B 5/1296* (2013.01); *H03L 1/021* (2013.01); *H03L 7/0991* (2013.01); *H03L 7/24* (2013.01); *H04L 27/227* (2013.01); *H03B 2200/009* (2013.01); *H03B 2200/0074* (2013.01)

(58) Field of Classification Search
  CPC ................ H03B 5/1296; H03B 5/1218; H03B 2200/0074; H03B 2200/009; H03L 7/0991; H03L 1/021; H03L 7/24; H04L 27/227
  USPC ...................... 331/2, 57, 46, 1 A, 50, 55, 37
  See application file for complete search history.

(56) References Cited

U.S. PATENT DOCUMENTS

| | | | |
|---|---|---|---|
| 8,638,175 B2* | 1/2014 | Dubey | H03K 3/0315 331/47 |
| 8,941,420 B2* | 1/2015 | Zerbe | H03L 7/16 327/119 |
| 9,154,145 B2* | 10/2015 | Zerbe | H03K 5/1565 |
| 9,588,497 B1 | 3/2017 | Monk et al. | |
| 9,705,521 B1 | 7/2017 | Monk et al. | |
| 2008/0284635 A1 | 11/2008 | Blatz et al. | |
| 2011/0110439 A1 | 5/2011 | Miyaoka et al. | |
| 2011/0298549 A1* | 12/2011 | Luong | H03L 7/0998 331/57 |
| 2012/0020677 A1 | 1/2012 | Noguchi et al. | |
| 2012/0154192 A1 | 6/2012 | Op | |
| 2013/0141143 A1 | 6/2013 | Sato | |
| 2013/0143509 A1 | 6/2013 | Horng et al. | |
| 2014/0079098 A1 | 3/2014 | Harjani et al. | |
| 2014/0369323 A1 | 12/2014 | Grankin et al. | |
| 2016/0099720 A1* | 4/2016 | Bashir | H03L 7/0991 331/8 |
| 2016/0336944 A1 | 11/2016 | Nakai | |

OTHER PUBLICATIONS

Saniei, N., et al., "A high speed SiGe VCO based on self injection locking scheme", Iranian Journal of Science and Technology, vol. 31, No. B6, pp. 641-650, Dec. 31, 2007.
McNeill, J.A., "Split ADC" background linearization of VCO-based ADCs. IEEE Transactions on Circuits and Systems I: Regular Papers, vol. 62, Issue 1, pp. 49-58, Oct. 24, 2014.
Melville, R., et al., "An injection locking scheme for precision quadrature generation", IEEE Solid-State Circuits Conference ESSCIRC 2001. pp. 17-20, Sep. 3, 2001.
Gosh, A. et al., "Linearization Through Dithering: A 50 MHz Bandwidth, 10-b ENOB, 8.2 mW VCO-Based ADC," IEEE JSSC, vol. 50, No. 9, pp. 2012-2024, Sep. 2015.
Reddy, K. et al., "A 16-mW 78-dB SNDR 10-MHz BW CT ADC using residue-cancelling VCO-based quantizer," IEEE JSSC, vol. 47, No. 12, pp. 2916-2927, Dec. 2012.
Yoon, Y. et al., "A time-based bandpass ADC using time-interleaved voltage-controlled oscillators," IEEE TCAS I, Reg. Papers, vol. 55, No. 11, pp. 3571-3581, Dec. 2008.
Si,R. et al., "A 100MHz S/s, 7 bit VCO-based ADC which is used in Time Interleaved ADC Architectures," 2nd International Conference on Consumer Electronics, Communications and Networks (CECNet), pp. 4-7, Apr. 2012.
Iwata, A. et al., "The architecture of delta sigma analog-to-digital converters using a voltage-controlled oscillator as a multi-bit quantizer," IEEE Trans. Circuits Syst. II, vol. 46, No. 7, pp. 941-945, Jul. 1999.
Straayer, M. et al., "A 12-bit 10-MHz bandwidth, continuous time sigma-delta ADC with a 5-bit, 950-MS/S VCO-based quantizer," IEEE J.Solid-State Circuits, No. 4, pp. 805-814, Apr. 2008.
Taylor, G. et al., "A mostly-digital variable-rate continuous-time Delta-Sigma modulator ADC," IEEE Journal of, vol. 45, No. 12, pp. 2634-2646, 2010.
Rao, S. et al., "A deterministic digital background calibration technique for VCO-based ADCs," IEEE J. Solid-State circuits, vol. 49, No. 4, pp. 950-960, Apr. 2014.
Naiknaware, R. et al., "Time-referenced single-path multi-bit ΔΣ ADC using a VCO-based quantizer," IEEE Trans. Circuits Syst. II, Analog Digit. Signal Process., vol. 47, No. 6, pp. 596-602, Jun. 2000.
El-Halwagy, W., "A programmable 8-bit, 10MHz Bw, 6.8mW, 200MSample/sec, 70dB SNDR VCO-based ADC using SC feedback for VCO linearization," IEEE (ICECS), 2013.
Zaliasl, S. et al., and T. S. Fiez, "A 12.5-bit 4 MHz 13.8 mW MASH modulator with multirated VCO-based ADC," IEEE TCAS I, vol. 59, No. 8, pp. 1604-1613, Aug. 2012.
Park, M. et al., "A 78 dB SNDR 87 mW 20 MHz bandwidth continuous-time ADC with VCO-based integrator and quantizer implemented in 0.13 m CMOS," IEEE JSSC, vol. 44, No. 12, pp. 3344-3358, Dec. 2009.
Staszewski, R.B. et al., "All-digital PLL and transmitter for mobile phones," IEEE JSSC, vol. 40, No. 12, pp. 2469-2482, Dec. 2005.
Kim, J. et al., "Analysis and design of voltage-controlled oscillator based analog-to-digital converter," IEEE Trans. Circuits Syst. I, vol. 57, No. 1, pp. 18-30, Jan. 2010.
Xing, X. et al., "A 42 fJ/Step-FoM Two-Step VCO-Based Delta-Sigma ADC in 40 nm CMOS," IEEE J. Solid-State Circuits, vol. 50, No. 3, pp. 714-723, Dec. 2015.
Hoven, M. et al., "Delta-Sigma Modulators Using Frequency-Modulated Intermediate Values," IEEE J. Solid-State Circuits, vol. 32, No. 11, pp. 13-22, Jan. 1997.
Gupta, A. et al., "A two-stage ADC architecture with VCO-based second stage," IEEE Trans. Circuits Syst. II, Exp. Briefs, vol. 58, No. 11, pp. 734-738, Nov. 2011.
Wismar, U. et al., "A 0.2 V 0.44 μW 20 kHz Analog to Digital ΣΔ Modulator with 57 fJ/conversion FoM," Proc. of the ESSCIRC, pp. 187-190, Sep. 2006.
Cui, S. et al., "A Highly Linear CMOS Current-Controlled Oscillator Using a Novel Frequency Detector," IEEE ISCAS, pp. 2841-2844, May 2008.
Hor, H. C. et al., "Review on VCO based ADC in Modern Deep Submicron CMOS Technology," IEEE International Symposium on RFIT, 2012.
International Search Report PCT/ISA/210 dated Feb. 2, 2017, International Application PCT/US2016/055836.

* cited by examiner

MULTI-STAGE SUB-THZ FREQUENCY GENERATOR INCORPORATING INJECTION LOCKING

REFERENCE TO PRIORITY APPLICATION

This application claims priority to U.S. Provisional Application Ser. No. 62/621,611, filed Jan. 25, 2018, entitled "Multi-Stage Sub-THz Frequency Generator Using Injection Locking," incorporated herein by reference in its entirety.

FIELD OF THE INVENTION

The present invention relates to the field of semiconductor integrated circuits and more particularly relates to a multi-stage sub-THz frequency generator that utilizes injection locking techniques.

BACKGROUND OF THE INVENTION

High frequency oscillators are the key blocks in mm-wave front-end circuits which are mainly focusing on short-range high-speed links (e.g., IEEE 802.1 lad/y, mm-wave 5G), FMCW automotive radars (e.g., 76-81 GHz), and imaging and security applications above 100 GHz. Currently, many high frequency oscillators are typically implemented in silicon/germanium (SiGe) technology due to wider RF passive devices support, higher speeds over earlier CMOS nodes, and potential baseband integration through BiCMOS extensions which are more expensive compared to CMOS technology. On the other hand, designing high speed oscillators in CMOS technology is much more challenging since the quality factor of passive components are lower than other technology.

There is thus a need for a high frequency oscillator that does not suffer from the disadvantages of the prior art. The oscillator should have improved phase noise and power efficiency and not require use of a buffer or amplifier at the output.

SUMMARY OF THE INVENTION

A novel and useful mm-wave frequency generation system is disclosed that takes advantage of injection locking techniques to generate an output oscillator signal with improved phase noise (PN) performance and power efficiency. A fundamental low frequency (e.g., ~30 GHz K-band) signal and its sufficiently strong higher (e.g., fifth) harmonic at a high frequency (e.g., ~150 GHz D-band) are generated simultaneously in a single oscillator.

Several features and advantages of the oscillator architecture of the present invention includes: (1) injecting pulse generator harmonics to a first oscillator; (2) injecting the higher (e.g., fifth) harmonic to a second oscillator; (3) generating higher (e.g., fifth) harmonics in class F; (4) injecting the higher (e.g., fifth) harmonic of class F to a second oscillator rather than extract it; and (5) not requiring a buffer and delivering maximum power at a relatively high frequency and without the need for a power hungry power amplifier.

Note that the oscillator architecture of the present invention has been implemented in 28 nm CMOS technology. Using the circuit structure described herein, the total power consumption of the system is approximately 40 mW while it delivers 1.7 dBm output power at 150 GHz. As a result, a very low phase noise oscillator with high power efficiency can be achieved using CMOS technology.

The oscillator system described herein is suitable for automotive radar, phased array, imaging, and security applications since it exhibits very good phase noise and output power. Moreover, since it provides relatively high output power at 150 GHz with tight coupling to the 30 GHz stage, it can be directly connected to an antenna and function as a power amplifier. In addition, due to its low power consumption, the oscillator system can be used in systems which need to save power.

There is thus provided in accordance with the invention, an oscillator system, comprising a reference frequency pulse generator operative to generate a reference signal containing a plurality of harmonics, a first oscillator operative to receive said reference signal output by said pulse generator and to generate a first fundamental frequency and one or more harmonic signals therefrom, wherein said first oscillator is injection locked to said pulse generator, and a second oscillator operative to receive one of the harmonic signals output by said first oscillator, and to generate an output signal therefrom, wherein said second oscillator is injection locked to said first oscillator.

There is also provided in accordance with the invention, an oscillator system, comprising a pulse generator having relatively good phase noise operative to generate a reference frequency signal containing a plurality of harmonics, a first oscillator operative to generate a millimeter wave output fundamental signal along with a higher harmonic signal, wherein said first oscillator is injection locked to said reference frequency signal output of said pulse generator, and a second oscillator normally having relatively poor phase noise operative to generate an output oscillator signal at an output node having relatively good phase noise, wherein said second oscillator is injection locked to said first oscillator causing the phase noise of said second oscillator to track that of said first oscillator.

There is further provided in accordance with the invention, a method of generating an oscillator signal, comprising generating a reference frequency signal, first injection locking a first oscillator and to the reference frequency signal thereby generating a millimeter wave first oscillator signal along with a harmonic signal, wherein phase noise of said first oscillator tracks that of said reference frequency signal, and second injection locking a second oscillator to the harmonic signal and generating an output oscillator signal therefrom at an output node, and wherein the phase noise of said second oscillator tracks that of said first oscillator.

There is also provided in accordance with the invention, an oscillator system, comprising a pulse generator having relatively good phase noise operative to generate a reference frequency signal having a plurality of harmonics, a first oscillator operative to receive the reference frequency signal and to generate a fundamental signal along with a higher harmonic signal therefrom, wherein said first oscillator is injection locked to the reference frequency signal output of said pulse generator, a second oscillator normally operative to generate a first output oscillator signal at an output node, wherein said second oscillator is injection locked to said first oscillator causing the phase noise of said second oscillator to track that of said first oscillator, and a third oscillator operative to generate a second output signal, wherein said third oscillator indirectly injection locked to said reference frequency signal output of said pulse generator causing the phase noise of said third oscillator to track that of said pulse generator.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION OF THE INVENTION

The present invention is a novel and useful mm-wave frequency generation system that takes advantage of injection locking techniques to generate an output oscillator signal with improved phase noise (PN) performance and power efficiency. A fundamental low frequency (e.g., 30 GHz) signal and its sufficiently strong higher (e.g., fifth) harmonic at a high frequency (e.g., 150 GHz) are generated simultaneously in a single oscillator.

Figure 1:
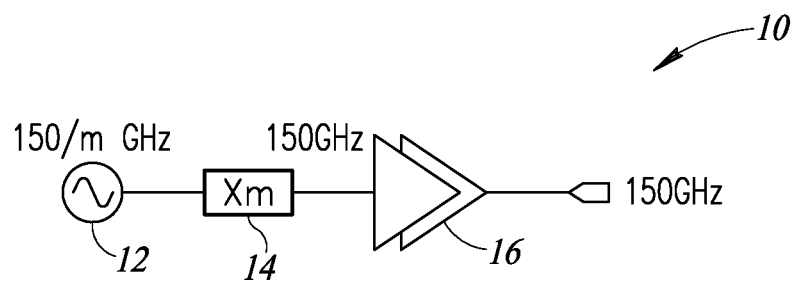
FIG. 1 is a high-level block diagram illustrating an example high frequency oscillator employing multiplier techniques.

A high-level block diagram illustrating an example high frequency oscillator employing a multiplier technique is shown in FIG. 1. In this embodiment, the oscillator, generally referenced 10, comprises a relatively low frequency reference 12 (150/m GHz). This reference is multiplied m times via frequency multiplier block 14. The output is buffered and amplified via amplifier 16 to generate the desired oscillator output frequency (150 GHz in this example). Oscillators based on frequency multipliers at this high frequency typically have limited locking range or consume large amounts of power in order to achieve large locking range.

Figure 2:
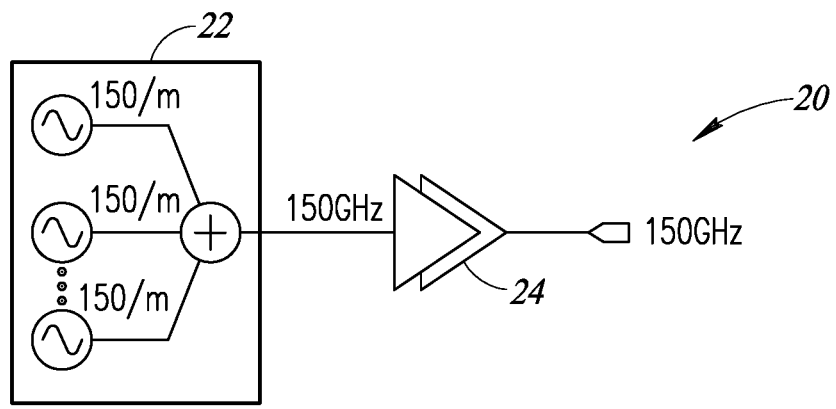
FIG. 2 is a high-level block diagram illustrating an example high frequency oscillator employing push-push techniques.

A high-level block diagram illustrating an example high frequency oscillator employing a push-push technique is shown in FIG. 2. In this example, the oscillator, generally referenced 20, comprises a 150/m GHz push-push oscillator block 22 containing m-push oscillators. The push-push technique is used to obtain oscillation at high frequencies. The output of block 22 is buffered and amplified via amplifier 24 to generate the desired oscillator output frequency (150 GHz in this example).

An oscillator with m-push oscillators utilize frequency dividers operating at 150/m GHz, avoiding the use of frequency multipliers. This oscillator type, however, suffers from low output power and mismatches among the m oscillators. Among this type, push-push oscillators are the most common and easiest to implement. The required large common mode (CM) swing, however, can increase the 1/f noise upconversion. Moreover, the conversion from single-ended CM signal to a differential output may introduce large phase error.

Both of these oscillator circuits, suffer from high power consumption and low output power. Thus, the power efficiency of these oscillator circuit techniques is a significant bottleneck to using them in real world applications.

Figure 3:
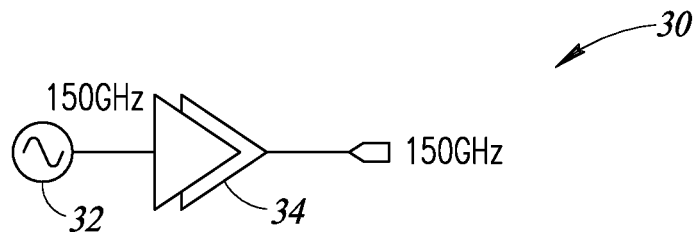
FIG. 3 is a high-level block diagram illustrating an example fundamental high frequency oscillator.

A high-level block diagram illustrating an example fundamental high frequency oscillator is shown in FIG. 3. As shown in FIG. 3, the oscillator, generally referenced 30, comprises a high frequency reference 32 (e.g., 150 GHz), and amplifier 34 which functions to generate the oscillator output at a high fundamental frequency. This is one of the first requirements of designing a high-speed oscillator. This technique, however, is not sufficient at high frequency where it is restricted by the $f_{max}$ of the semiconductor process devices used to construct to the oscillator. Thus, the phase noise and gain requirements are not met. Moreover, the quality factor of passive components deteriorates at relatively high frequencies.

Several difficulties of designing oscillators of the type described supra include (1) the parasitic capacitance of active devices takes up a large share of the relatively small tank capacitance, thus limiting the frequency tuning range; (2) to achieve a tuning range of >15%, the poor Q-factor of the tuning capacitance dominates the Q-factor of the resonator, thus limiting the achievable phase noise. The 150 GHz frequency dividers must achieve large locking range to ensure sufficient overlap with the oscillator tuning range under PVT variations. There is a strong tradeoff, however, between the locking range and the power consumption.

To alleviate the design challenges for mm-wave oscillators and dividers without shifting more stress onto other blocks, a 150 GHz frequency generation technique based on a 30 GHz oscillator and higher (e.g., fifth) harmonic is disclosed. To realize that goal, the higher (e.g., fifth) harmonic as well as the fundamental are applied to a 30 GHz transformer-based dual-resonance oscillator. Using this technique, the higher (e.g., fifth) harmonic is the signal of interest.

In accordance with the invention, both a low frequency fundamental (e.g., 30 GHz) and a significant level of its higher (e.g., fifth) harmonic at a high frequency (e.g., 150 GHz) are simultaneously generated within a low frequency, e.g., 30 GHz, oscillator. The generated 150 GHz signal is fed to a second high frequency oscillator. Since, in one embodiment, the oscillator runs at the fundamental frequency of 30 GHz, its resonant tank achieves a better Q-factor than at 150 GHz, which leads to better PN performance. Moreover, the tank has a larger inductance and capacitance. This increases the variable portion of the total tank capacitance and the frequency tuning range.

Figure 4:
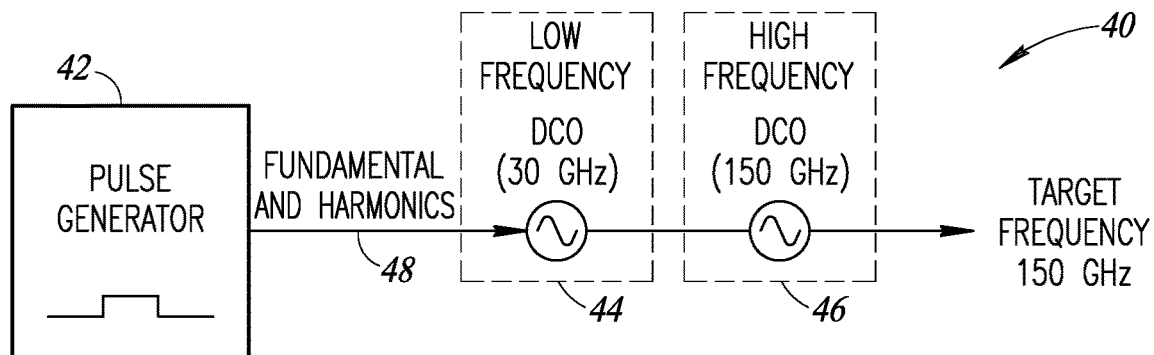
FIG. 4 is a high-level block diagram illustrating an example multi-stage high-frequency oscillator utilizing injection locking techniques.

A high-level block diagram illustrating an example multi-stage high-frequency oscillator utilizing injection locking techniques is shown in FIG. 4. The oscillator, generally referenced 40, comprises pulse generator 42, first low frequency digitally controlled oscillator (DCO) 44, and second high frequency DCO 46. The second DCO is operative to generate and output the target frequency (150 GHz in this example embodiment).

In this example embodiment, the oscillator architecture is based on an injection locking technique. The pulse generator 42 functions as a reference frequency. This eases the design of the frequency divider when the oscillator 40 is used to implement a phase locked loop (PLL). The pulse generator is operative to generate one or more harmonics (n harmonics in this example). The low frequency DCO 44 is injection locked to one of the harmonics generated by the pulse generator. In this example embodiment, the pulse generator fundamental period is 60 ps which corresponds to approximately 16 GHz. The second harmonic at 32 GHz is injection locked to the first low frequency DCO.

In one embodiment, the first DCO comprises a 30 GHz oscillator such as a class F oscillator adapted to produce relatively strong 5th harmonics at 150 GHz. Since the first oscillator is injection locked to the pulse generator which is designed to exhibit relative very good phase noise, the first oscillator output signal (i.e. fundamental as well as harmonics) also has relatively very clean phase noise as well.

The second DCO comprises a relatively high frequency oscillator circuit. In one example, the second oscillator is adapted to generate a 150 GHz signal. The second DCO, however, is designed to normally exhibit relatively poor phase noise performance, i.e. when the DCO is stand-alone without any injection locking in order to conserve power. The signal output of the class F oscillator (i.e. first DCO) is injection locked to the second oscillator which normally features poor phase noise. Note that the strong 5th harmonic of the first oscillator can be injected simultaneously with the fundamental frequency (e.g., 30 GHz) signal to the second oscillator stage, i.e. the high frequency oscillator which in this example embodiment is 150 GHz. This causes the second 150 GHz oscillator to lock relatively easily to the first 30 GHz oscillator. Consequently, the second high frequency oscillator tracks the phase noise of the first oscillator within a relatively wide locking range.

Thus, using this injection locking technique relaxes the design challenges of the second oscillator at 150 GHz at least from a phase noise point of view. Since the injection signal generated by the first oscillator is strong, the second oscillator having wide locking range is locked to the first oscillator and tracks its phase noise. Moreover, since the second oscillator (e.g., 150 GHz) is used as the output stage instead of a multiplier in the architecture described supra, it provides relatively high output voltage swing and high output power at 150 GHz while consuming less power.

Figure 5:
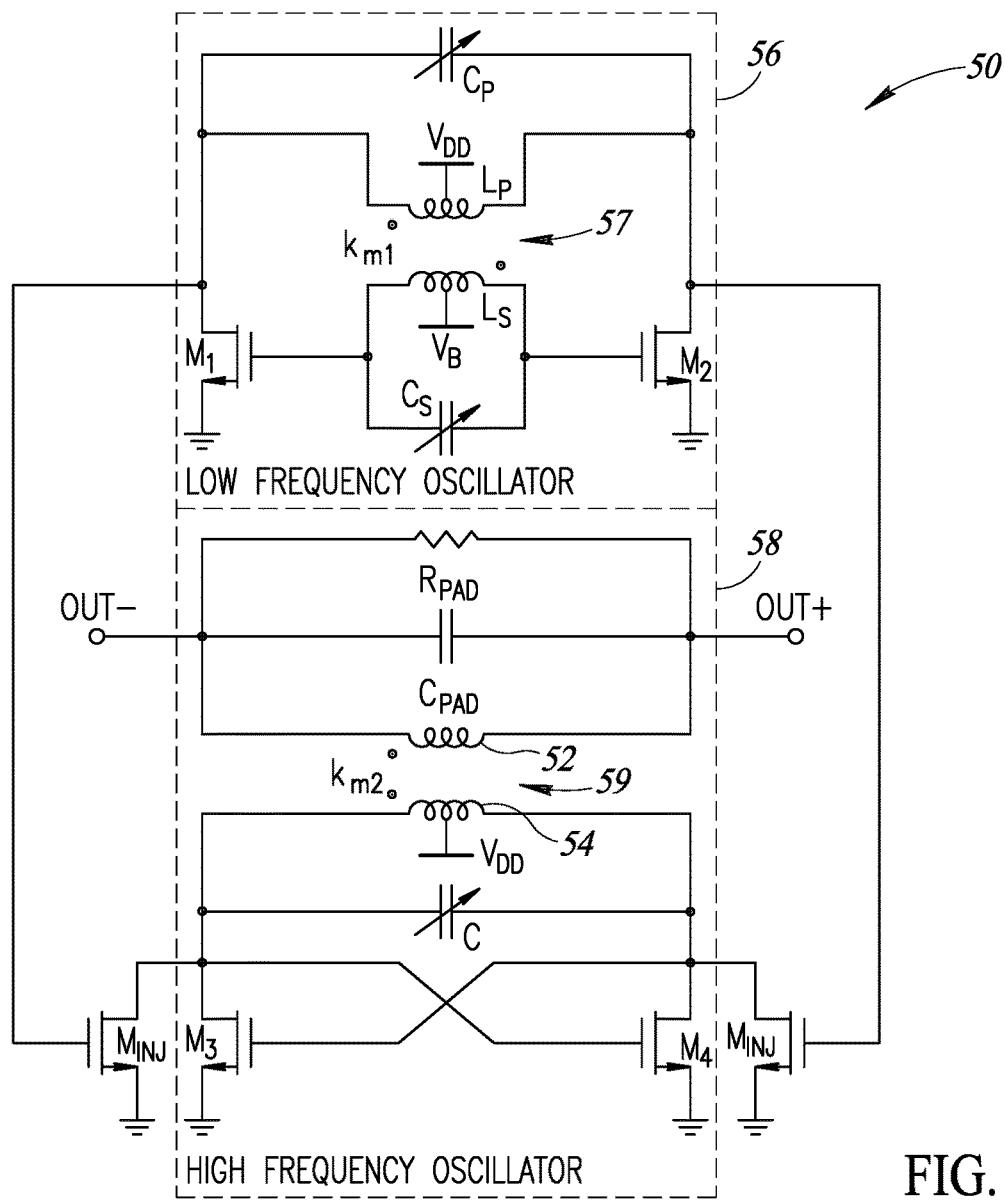
FIG. 5 is a schematic diagram illustrating an example multi-stage high-frequency oscillator utilizing injection locking techniques.

A schematic diagram illustrating the circuit implementation of an example multi-stage high-frequency oscillator utilizing injection locking techniques is shown in FIG. 5. The injection oscillator functions to boost the higher (e.g., fifth) harmonic generated by the first DCO. The oscillator, generally referenced 50, comprises two sub-oscillators including a low frequency oscillator 56 (e.g., 30 GHz) and a high frequency oscillator 58 (e.g., 150 GHz). The low frequency oscillator 56 comprises transformer 57 based tank while the high frequency oscillator 58 comprises transformer 59 based tank.

The class F low frequency oscillator 56 comprise transistors $M_1$ and $M_2$ and is adapted to produce relatively strong $5^{th}$ harmonics. Using the injection transistors $M_{inj}$, the $5^{th}$ harmonics of the low frequency oscillator 56 is injected to the second stage high frequency oscillator 58 via transistors $M_3$ and $M_4$ which in one example embodiment comprises a 150 GHz oscillator normally having relatively poor phase noise. At the output stage, in order to separate the output node from pad parasitics and also deliver maximum power to output, transformer 59 with coupling factor $k_{m2}$ is used. Note that a load-pull simulation has been performed at the output stage to determine the required impedance which provides both oscillation and delivers maximum power to the output node.

The class F low frequency oscillator 56 comprise transistors Mi and M2 and is adapted to produce relatively strong $5^{th}$ harmonics. Using the injection transistors $M_{inj}$, the $5^{th}$ harmonics of the low frequency oscillator 56 is injected to the second stage high frequency oscillator 58 via transistors $M_3$ and $M_4$ which in one example embodiment comprises a 150 GHz oscillator normally having relatively poor phase noise. At the output stage, in order to separate the output node from pad parasitics and also deliver maximum power to the output, transformer 59 with coupling factor $k_{m2}$ is used. Note that a load-pull simulation has been performed at the output stage to determine the required impedance which provides both oscillation and delivers maximum power to the output node.

In one embodiment, the L and C ratios in primary and secondary windings of the transformer based dual tank resonator were optimized to realize fundamental oscillation and its higher (e.g., fifth) harmonic resonance.

Figure 6:
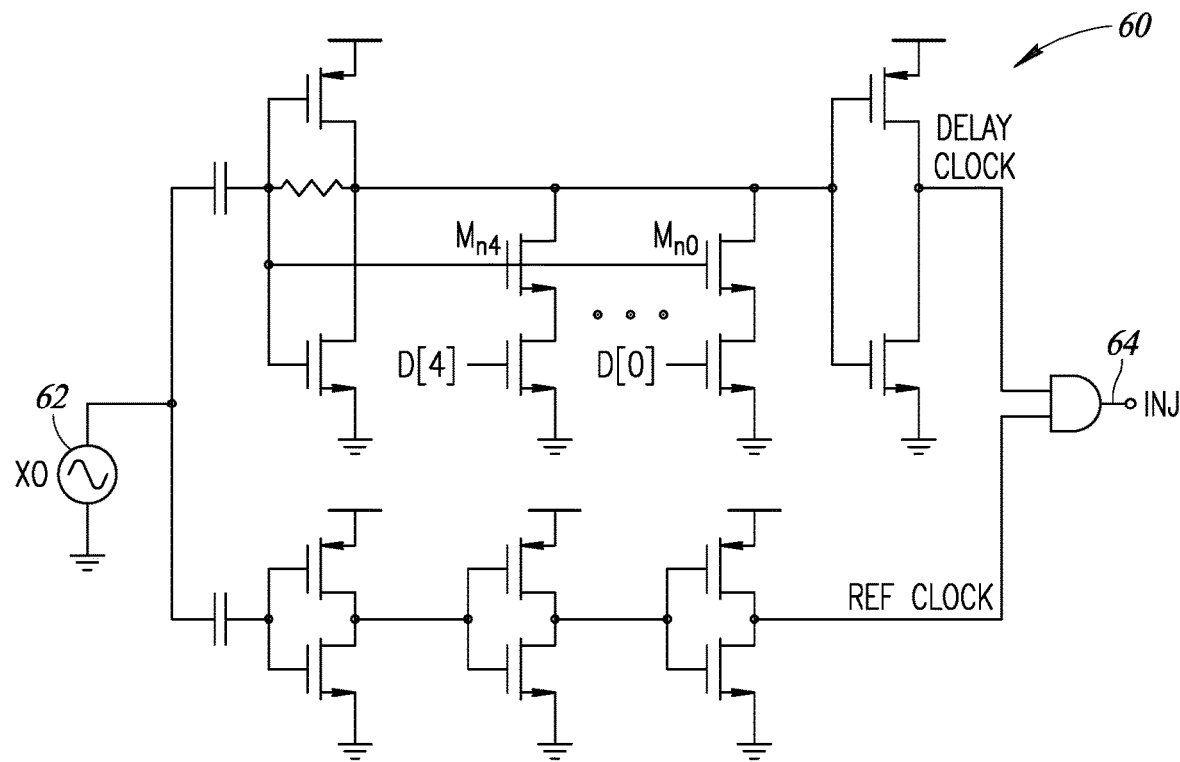
FIG. 6 is a schematic diagram illustrating an example pulse generator.

A schematic diagram illustrating an example pulse generator is shown in FIG. 6. The pulse generator, generally referenced 60, comprises a frequency reference source 62 that may comprise a crystal oscillator (XO), an external frequency reference, e.g., having sinusoidal shape, etc., or a ring oscillator. The pulse generator is operative to generate an output reference signal 64 having any desired pulse width in accordance with the particular implementation of the invention, e.g., 10-30 or 55-70 ps.

In the example embodiment shown, the noise-free pulse generator comprises a crystal oscillator (XO) slicer that combines the programmable edge delay. The voltage offset ΔV gets converted to time offset ΔT (by adding extra offset-inducing transistors) by delaying the threshold detection of the sinusoidal waveform. This mechanism does not appreciably add any extra noise. Note that the pulse width is controlled from 10-30 ps (or 55-70 ps) with a multibit code.

Figure 7:
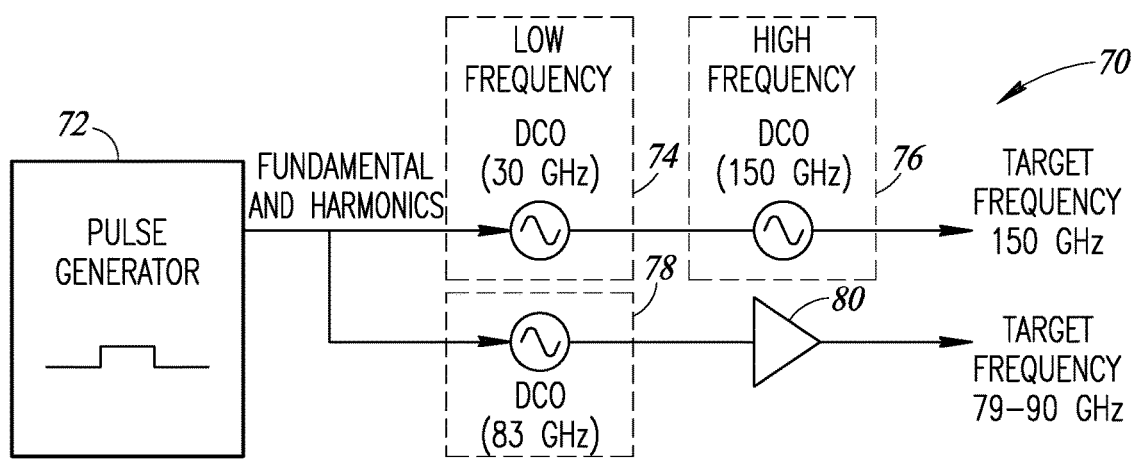
FIG. 7 is a schematic diagram illustrating an example multi-stage dual high-frequency oscillator utilizing injection locking techniques.

A schematic diagram illustrating an example multi-stage dual high-frequency oscillator utilizing injection locking techniques is shown in FIG. 7. In this additional embodiment, a dual mode 79/150 GHz band injection locked oscillator system is provided. The oscillator system, generally referenced 70, comprises pulse generator 72, first low frequency digitally controlled oscillator (DCO) 74, second high frequency DCO 76, third DCO 78, and buffer/amplifier 80. In one example embodiment, the first DCO runs at approximately 30 GHz, the second DCO at approximately 150 GHz, and the third DCO at approximately 83 GHz.

The third 79 GHz oscillator 78 is used in a second path which is locked directly to the pulse generator 72. In this embodiment, the first path is the same as the oscillator shown in FIG. 4, described in detail supra. In the second path, the 83 GHz oscillator 78 is locked to $5^{th}$ harmonics generated by the pulse generator. The output of the oscillator 78 is input to a buffer and/or amplifier to the output. Note that this embodiment is capable of simultaneously providing dual oscillators in the range of 145-165 GHz and 75-90 GHz for both FMCW automotive radars (e.g., 76-81 GHz) as well as imaging and security applications above 100 GHz.

Figure 8:
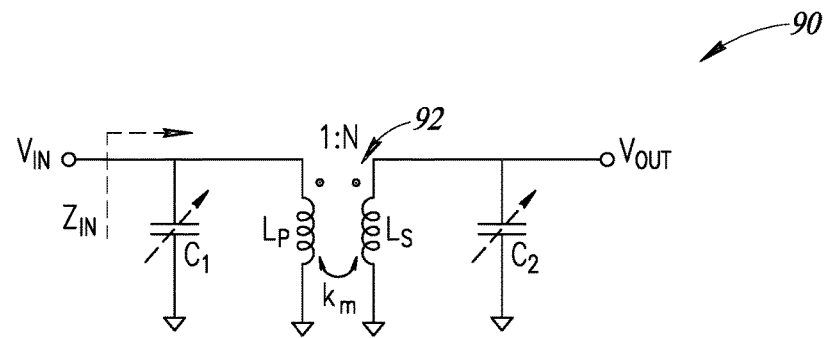
FIG. 8 is a schematic diagram illustrating an example transformer circuit.

A schematic diagram illustrating an example transformer circuit is shown in FIG. 8. The transformer circuit, generally referenced 90, comprises a transformer 92 with 1:n turns ratio and coupling factor $k_m$, primary $L_p$ and secondary $L_p$ windings, and tunable primary capacitor $C_1$ and secondary capacitor $C_2$. To provide adequate $5^{th}$ harmonic signal, the transformer 57 (FIG. 5) preferable has a relatively high coupling factor $k_m$.

Figure 9:
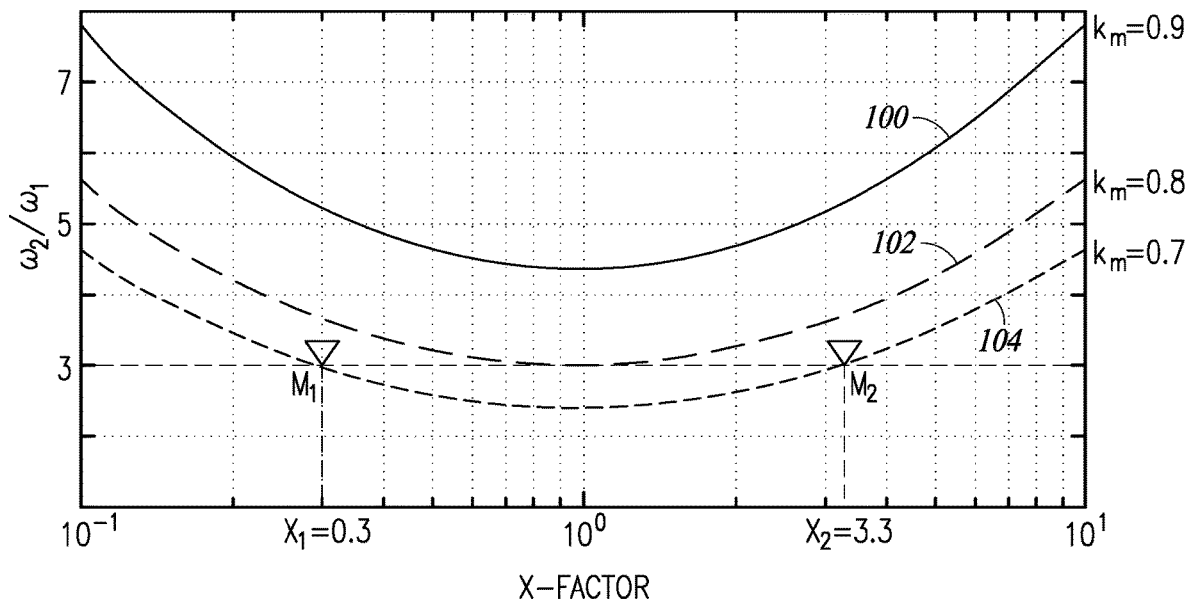
FIG. 9 is a diagram illustrating X-factor versus harmonic ratio for different values of $k_m$.

A diagram illustrating X-factor versus harmonic ratio for different values of $k_m$ is shown in FIG. 9. The X-factor is defined as follows $$X = \left(\frac{L_s}{L_p} \cdot \frac{C_2}{C_1}\right) \quad (1)$$

Trace 100 represents the harmonic ratio for $k_m=0.9$; trace 102 represents the harmonic ratio for $k_m=0.8$; and trace 104 represents the harmonic ratio for $k_m=0.7$.

Figure 10:
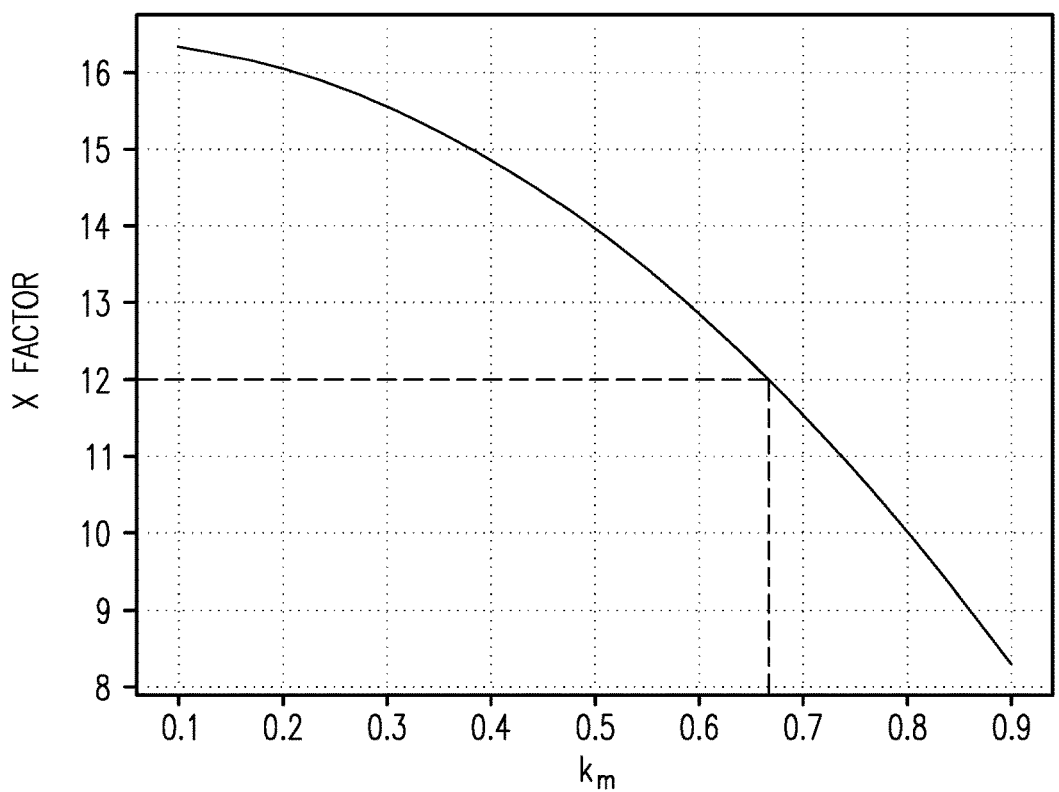
FIG. 10 is a diagram illustrating the dependency of X-factor on $k_m$.

A diagram illustrating the dependency of X-factor on $k_m$ when $$\frac{\omega_5}{\omega_1} = 5$$

is shown in FIG. 10. Note that an X-factor of 12 corresponds to a $k_m$ of 0.67. The required X-factor is used to select an appropriate value of the running capacitor.

Figure 11:
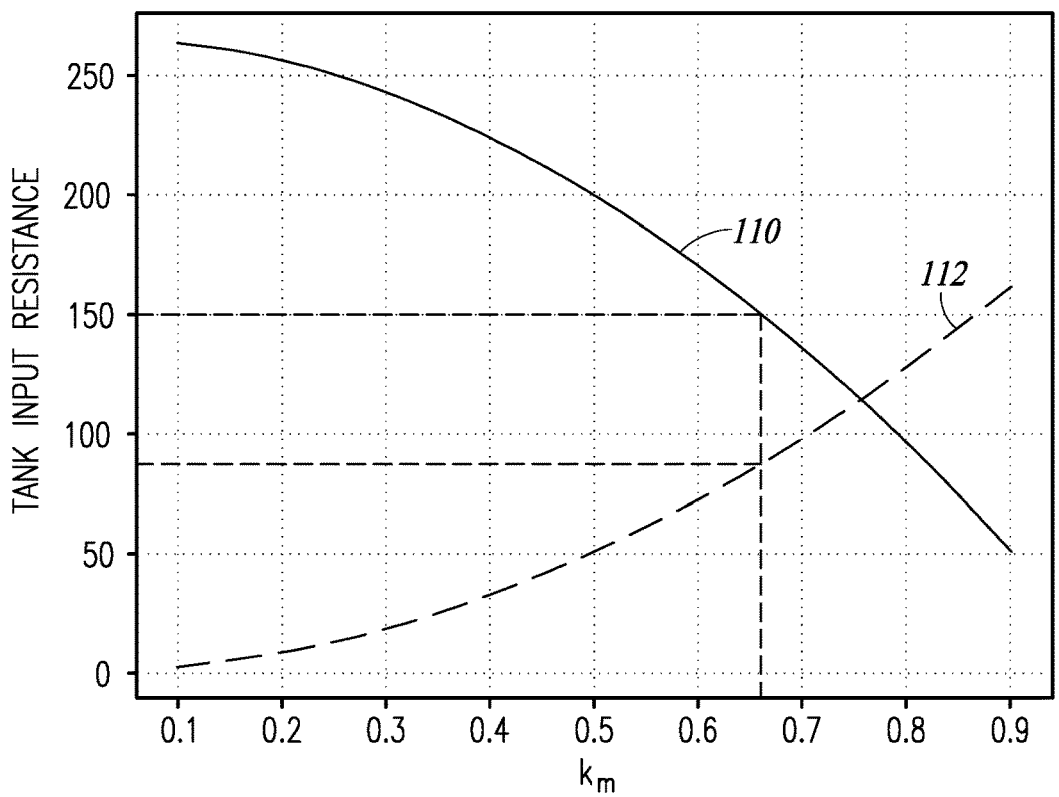
FIG. 11 is a diagram illustrating the dependency of tank input resistance on $k_m$.
Figure 12:
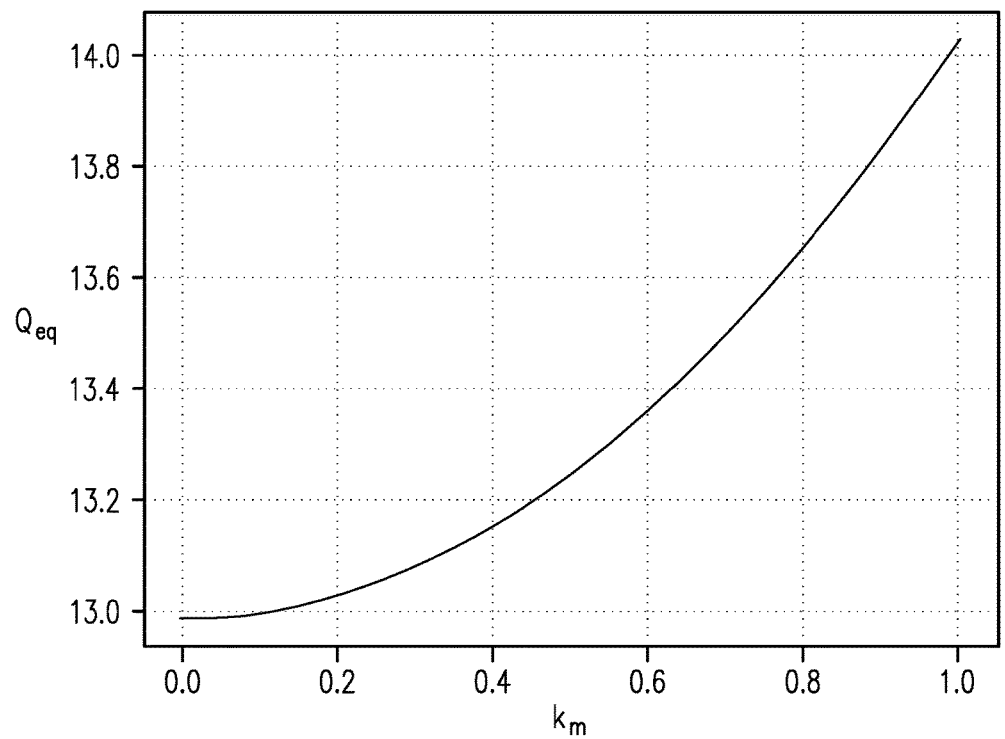
FIG. 12 is a diagram illustrating the dependency of equivalent quality factor of transient based resonant at 30 GHz on $k_m$.

A diagram illustrating the dependency of tank input resistance on $k_m$ is shown in FIG. 11. Trace 110 represents $R_{p5}$ while trace 112 represents $R_{p1}$. A diagram illustrating the dependency of equivalent quality factor of transient based resonant at 30 GHz on $k_m$ is shown in FIG. 12. It is noted that the higher (e.g., fifth) harmonic component generated by the first oscillator is the signal of interest. Thus, it is preferable to make it sufficiently stronger by configuring a larger $R_{p5}/R_{p1}$. On the other hand, however, the equivalent Q factor at the two resonant frequencies affect oscillator performance. A high Q factor at $\omega_{osc}$ (e.g., 30 GHz) promotes low phase noise, while low Q at $5\omega_{osc}$ is appreciated for better tolerance to possible frequency misalignment between the second resonance and $5\omega_{osc}$. As shown in FIG. 11, $R_{p1}$ decreases with smaller $k_m$ while $R_{p5}$ behaves opposite. Therefore, smaller $k_m$ is desired for large $R_{p5}/R_{p1}$ and in doing a passive gain for the $5^{th}$ harmonic is provided. As shown in FIG. 12, however, a larger $k_m$ is required for high Q at $\omega_{osc}$ to have better phase noise.

Figure 14:
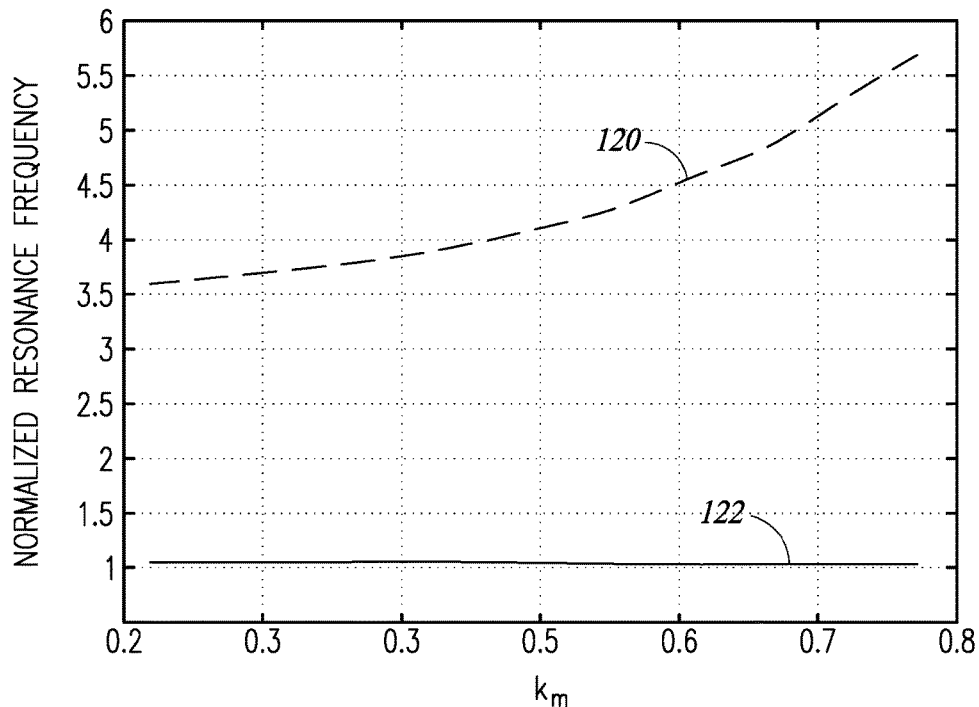
FIG. 14 is a diagram illustrating the dependency of the normalized resonance frequency on $k_m$.

In one embodiment, as a trade-off between a large higher (e.g., fifth) harmonic and optimal oscillator performance, $k_m=0.67$ is selected for $R_{p5}/R_{p1}=2$ with sufficient Q. A diagram illustrating the dependency of the normalized resonance frequency on $k_m$ is shown in FIG. 14 where trace 120 represents $\omega_5/30$ and trace 122 represents $\omega_1/30$. Under this condition, as the ratio of $\omega_{osc5}/\omega_{osc1}$ reaches the desired value of five for $k_m=0.67$ which corresponds to an X-factor of 12 (see FIG. 11).

Figure 13:
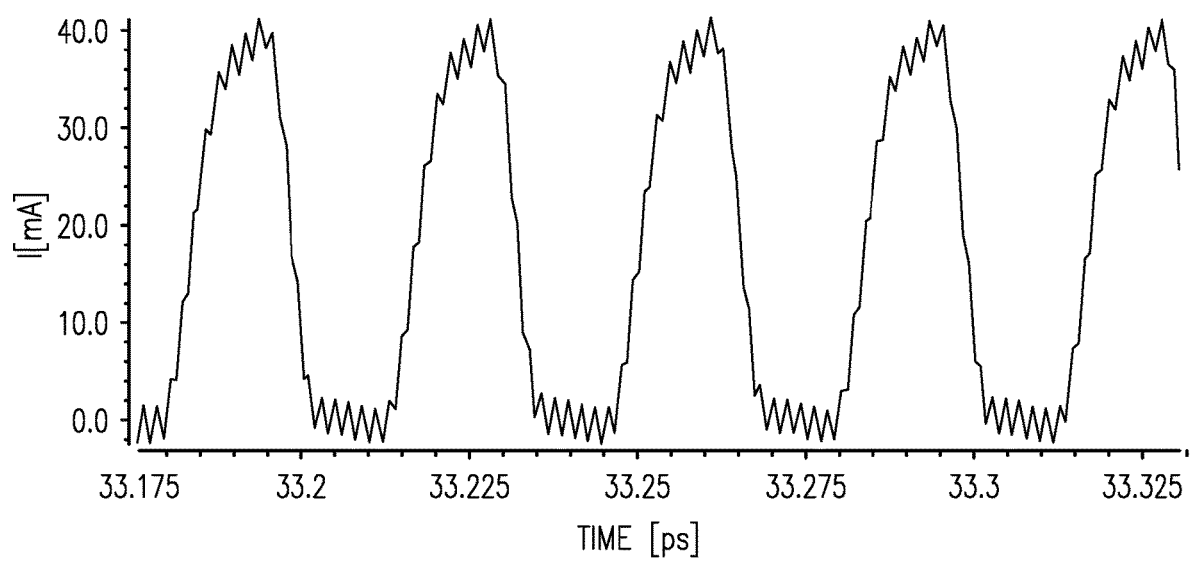
FIG. 13 is a diagram illustrating the drain current of the 30 GHz oscillator with strengthened $5^{th}$ harmonic.

Intuitively, we know that the drain current of oscillator in the presence of harmonics is close to a square wave as shown in FIG. 13 which illustrates the drain current of the low frequency (e.g., 30 GHz) oscillator with strengthened $5^{th}$ harmonic. It is also known that an ideal square wave with an amplitude of one can be represented as an infinite sum of sinusoid waves:

$$x(t) = \frac{4}{\pi} \sum_{k=1}^{\infty} \frac{\sin(2\pi(2k-1)ft)}{2k-1} \quad (2)$$

$$= \frac{4}{\pi}\left(\sin(2\pi ft) + \frac{1}{3}\sin(3*2\pi ft) + \frac{1}{5}\sin(5*2\pi ft) + \ldots\right).$$

According to Equation 2, the higher (e.g., fifth) harmonic is a very weak signal. Thus, having passive gain helps to inject a stronger higher (e.g., fifth) harmonic signal to the high frequency (e.g., 150 GHz) oscillator which improves the locking range of the oscillator system. This provide additional motivation to select a coupling factor of $k_m=0.67$.

Figure 22:
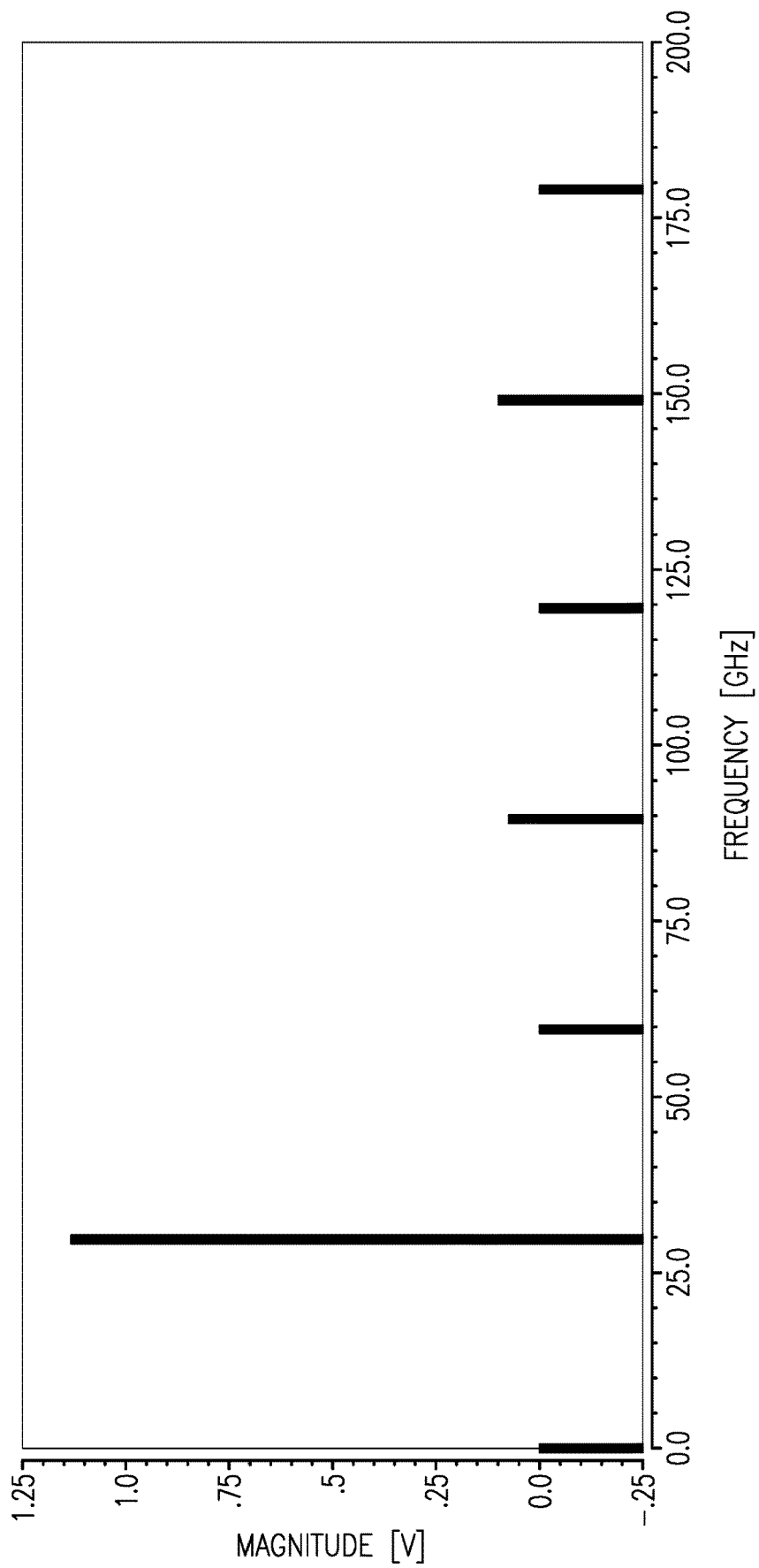
FIG. 22 is a diagram illustrating an example ratio of fifth harmonic to fundamental magnitude.

A diagram illustrating an example ratio of fifth harmonic to fundamental magnitude is shown in FIG. 22. As indicated, the output signal of the low frequency oscillator (e.g., 30 GHz class F oscillator) provides relatively strong fifth harmonics. Utilizing the passive gain boosted fifth harmonic, the magnitude ratio between fifth to first harmonics components of the drain oscillator voltages increases to almost 10%. This high ratio provides a strong injected signal to the second stage high frequency oscillator (e.g., 150 GHz) and helps it to lock with lower power consumption as well as having a wider locking range.

Figure 20:
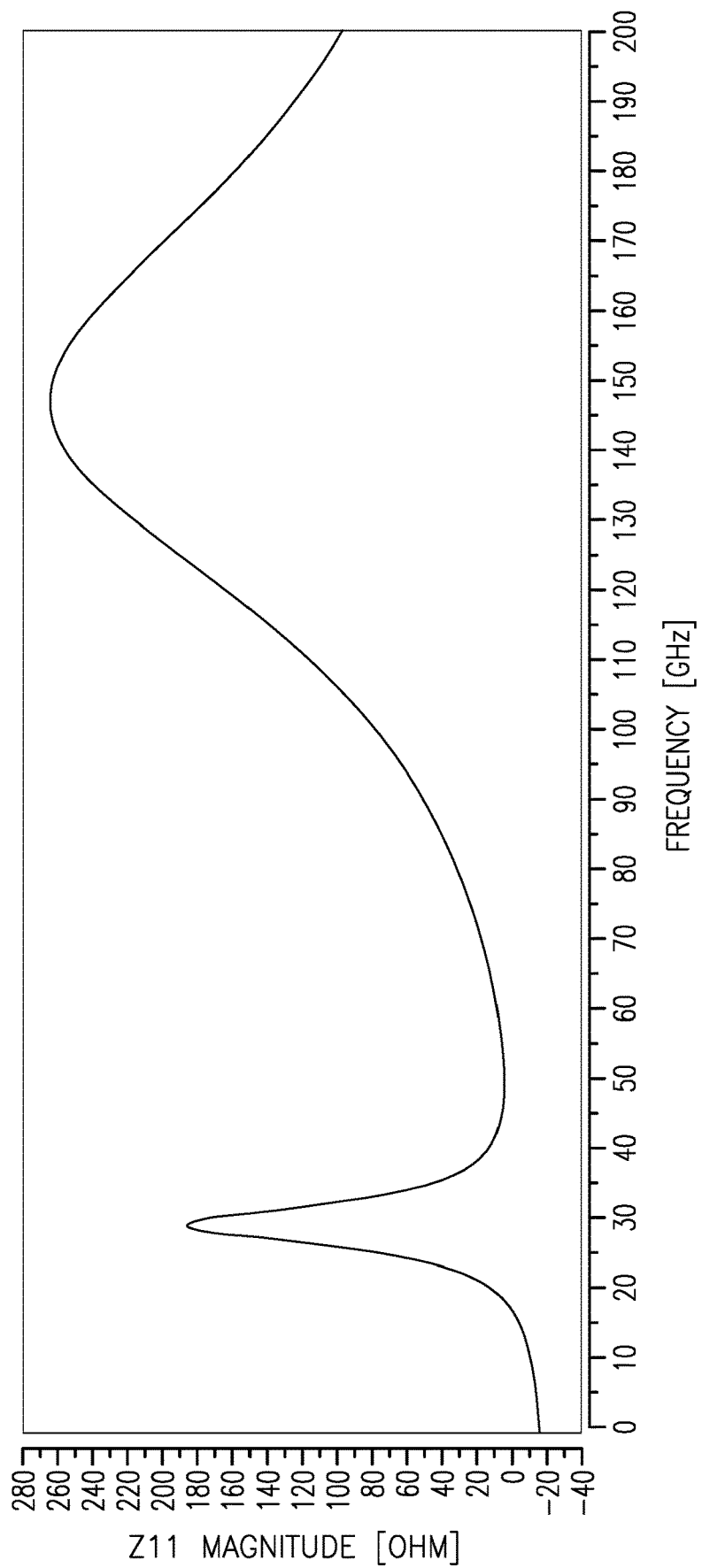
FIG. 20 is a diagram illustrating the transformed-based tank input impedance $Z_{11}$ magnitude.

A diagram illustrating the transformed-based tank input impedance $Z_{11}$ magnitude is shown in FIG. 20. The figure shows the tank input impedance with $k_m=0.67$. Note that a concern may arise that the oscillation could happen at $5\omega_{osc}$ (~150 GHz) rather than at $\omega_{osc}$ (~30 GHz) due to Rp5>Rp1. Start-up conditions are examined to ensure that the oscillation can only happen at $\omega_{osc}$, even if $R_{p5}>R_{p1}$. Barkhausen's phase and gain criteria should be satisfied for a stable oscillation.

Figure 21:
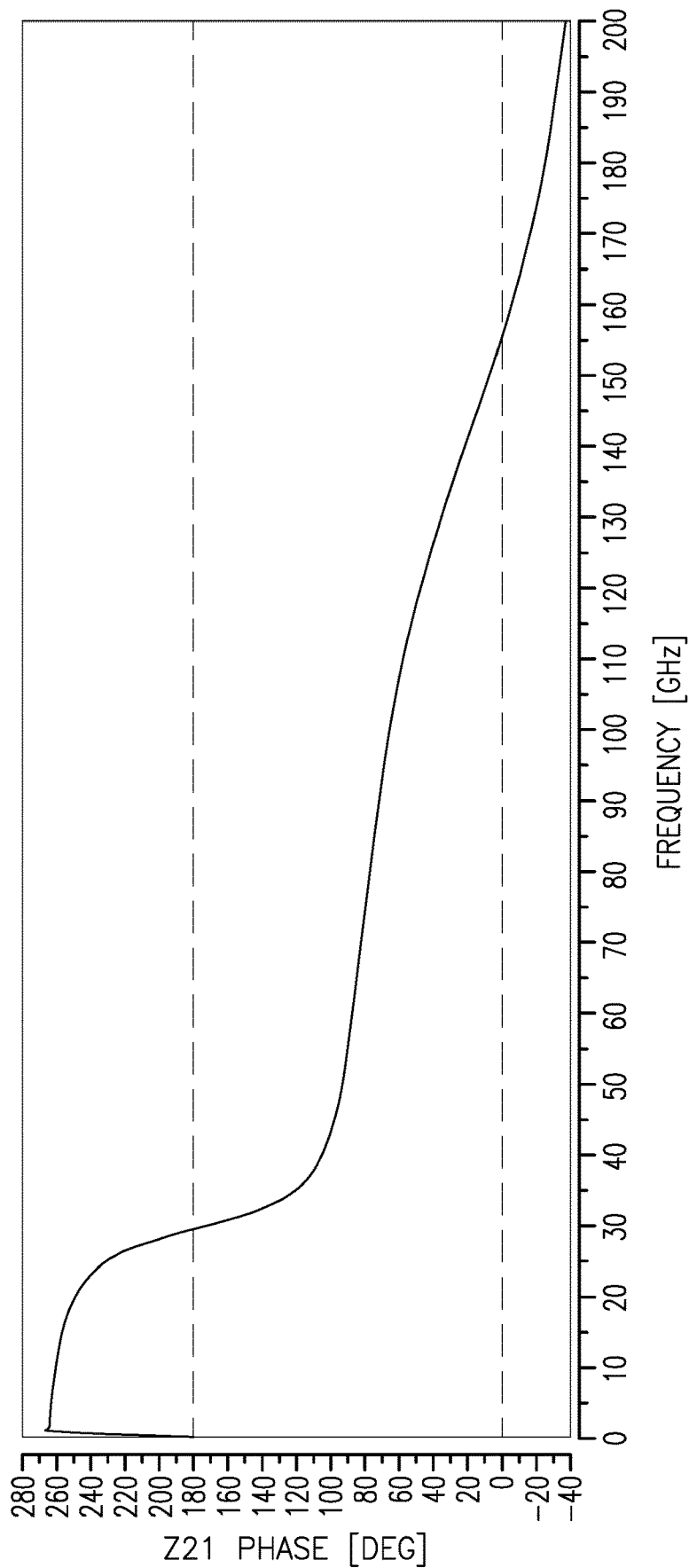
FIG. 21 is a diagram illustrating the transformed-based tank trans-impedance $Z_{21}$ magnitude.

A diagram illustrating simulated open loop response of the transformed-based tank trans-impedance $Z_{21}$ magnitude is shown in FIG. 21. This figure shows the open loop phase response of transimpedance $Z_{21}$. Note that the phase criterion is satisfied only at $\omega_{osc}$ which shows that there only one stable oscillation mode at ~30 GHz is possible here.

$$Z_{in} = \frac{s^3(L_pL_sC_2(1-k_m^2)) + s^2(C_2(L_sr_p+L_pr_s))+s(L_p+r_sr_pC_2)+r_p}{s^4(L_pL_sC_1C_2(1-km^2))+s^3(C_1C_2(L_sr_p+L_pr_s))+s^2(L_pC_1+L_sC_2+r_pr_sC_1C_2)+s(r_pC_1+r_sC_2)+1} \quad (3)$$

where $k_m$, $L_p$, $L_s$, $C_1$, $C_2$, $r_p$, and $r_s$ are the magnetic coupling factor of the transformer, primary and secondary inductance, tuning capacitor on the primary and secondary side, and model the equivalent series resistance of the primary and secondary inductance, respectively. In order to find the poles of this transfer function, the equation is solved for the denominator=0 which yields $$\omega_{1,2}^2 = \frac{1+\frac{L_sC_2}{L_pC_1}\pm\sqrt{1+\left(\frac{L_sC_2}{L_pC_1}\right)^2+\frac{L_sC_2}{L_pC_1}(4k_m^2-1)}}{2L_sC_2(1-k_m^2)} \quad (4)$$

Since we are interested in the higher (e.g., fifth) harmonic, the ratio $$\frac{\omega_2}{\omega_1} = 5,$$

as a result is given by $$\frac{\omega_2}{\omega_1} = \sqrt{\frac{1+X+\sqrt{1+X^2+X(4k_m^2-2)}}{1+X-\sqrt{1+X^2+X(4k_m^2-2)}}} = 5 \quad (5)$$

where $$X = \left(\frac{L_s}{L_p}\frac{C_2}{C_1}\right).$$

By solving Equation 5, we obtain X as a function of $k_m$, as shown in FIG. 9.

To determine $R_{p1}$ and $R_{p5}$, the real part of Equation 3 must be determined first as follows $$\Re\{Z_{in}(\omega)\} = \quad (6)$$

$$\frac{(r_p-\omega^2A))(C_1B\omega^4-C\omega^2+1)+\omega^2(D-B\omega^2)(E-C_1A\omega^2)}{(C_1B\omega^4-C\omega^2+1)^2+(E-C_1A\omega^2)^2}$$

where A, B, C, D, and E are calculated as follows $A = C_2(L_sr_p+L_pr_s)$ $B = L_pL_sC_2(1-k_m^2)$ $C = L_pC_1+L_sC_2+r_pr_sC_1C_2$ $D = (L_p+r_sr_pC_2)$ $E = (r_pC_1+r_sC_2) \quad (7)$ $R_{p1}$ and $R_{p5}$ are calculated as $R_{p1}=\Re\{Z_{in}(\omega_1)\}$, $R_{p5}=\Re\{Z_{in}(\omega_2)\}$ where it is known that $\omega_2=5\omega_1$. The results are shown in FIG. 11.

The transimpedance of the tank from primary to secondary winding is as follows $$Z_{21}(j\omega) = \frac{j\omega k_m\sqrt{L_pL_s}}{\omega^4(L_pL_sC_1C_2(1-km^2))-j\omega^3(C_1C_2(L_sr_p+L_pr_s))-\omega^2(L_pC_1+L_sC_2+r_pr_sC_1C_2)+j\omega(r_pC_1+r_sC_2)+1} \quad (8)$$

where the equivalent quality factor is derived from the phase response of the open-loop transfer function of $-G_mZ_{21}(j\omega)$ $$Q_{eq} = \frac{\omega}{2}\left|\frac{d[\angle -G_mZ_{21}(j\omega)]}{d\omega}\right| = \quad (9)$$

$$\frac{1+(k_m^2-1)\omega^4L_sL_pC_1C_2}{\frac{\omega^2L_pC_1}{Q_p}+\frac{\omega^2L_sC_2}{Q_s}-\left(\frac{1}{Q_p}+\frac{1}{Q_s}\right)\omega^4L_sL_pC_1C_2}$$

where $Q_p$ and $Q_s$ are the quality factor of the primary and secondary winding, respectively. Since the phase noise response is defined by the equivalent quality factor on the primary side. Note that Equation 9 has been plotted for the fundamental frequency $f_0=30$ GHz and as shown in FIG. 12.

Figure 15:
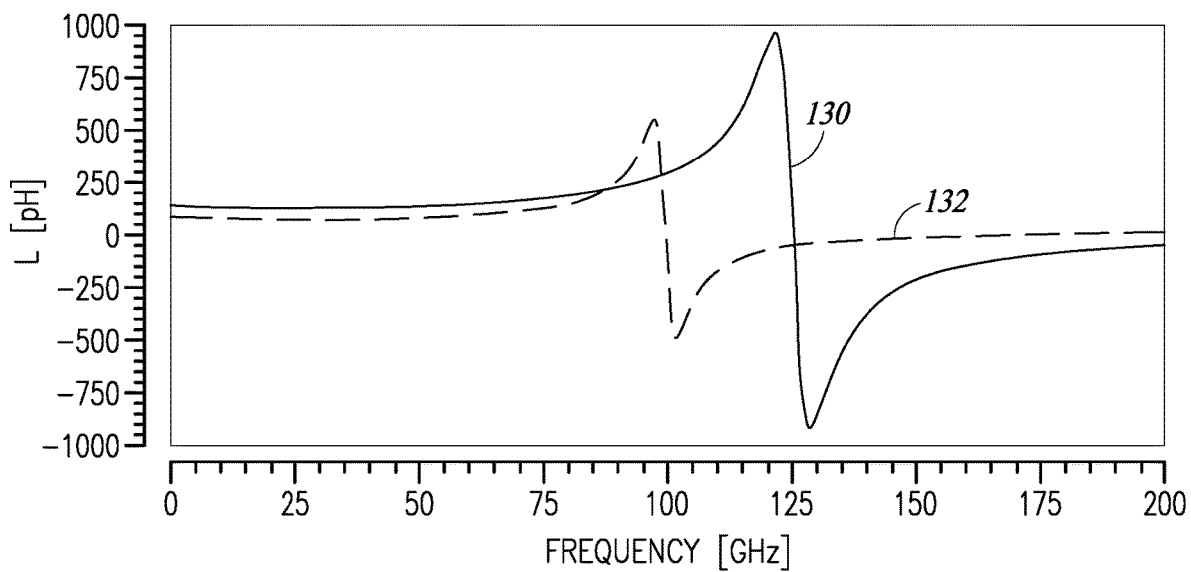
FIG. 15 is a diagram illustrating the primary and secondary inductance as a function of frequency.
Figure 16:
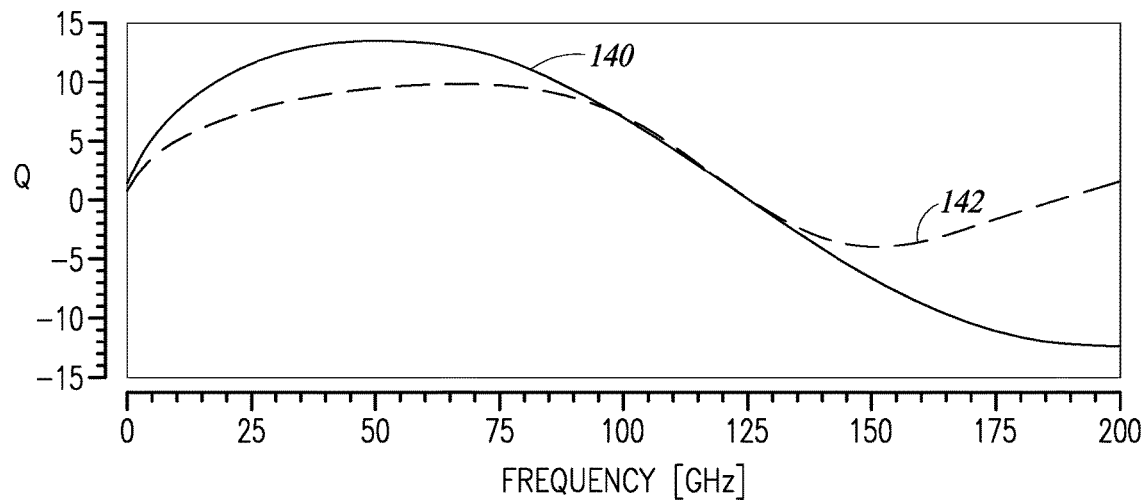
FIG. 16 is a diagram illustrating the primary and secondary quality factor (Q) as a function of frequency.
Figure 17:
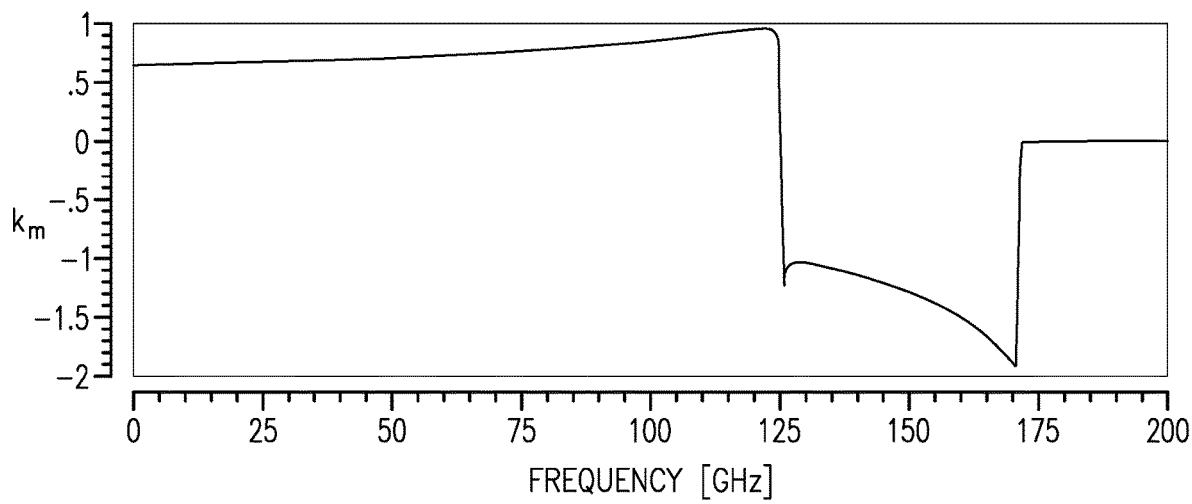
FIG. 17 is a diagram illustrating the transformer coupling factor as a function of frequency.

Several transformer characteristics are shown in FIGS. 15, 16, and 17. A diagram illustrating the primary and secondary inductance as a function of frequency is shown in FIG. 15 where trace 132 represents the primary and trace 130 represents the secondary inductance as a function of frequency. A diagram illustrating the primary and secondary quality factor (Q) as a function of frequency is shown in FIG. 16 where trace 140 represents the Q of the primary and trace 142 represents the Q of the secondary. A diagram illustrating the transformer coupling factor $k_m$ as a function of frequency is shown in FIG. 17.

Figure 18:
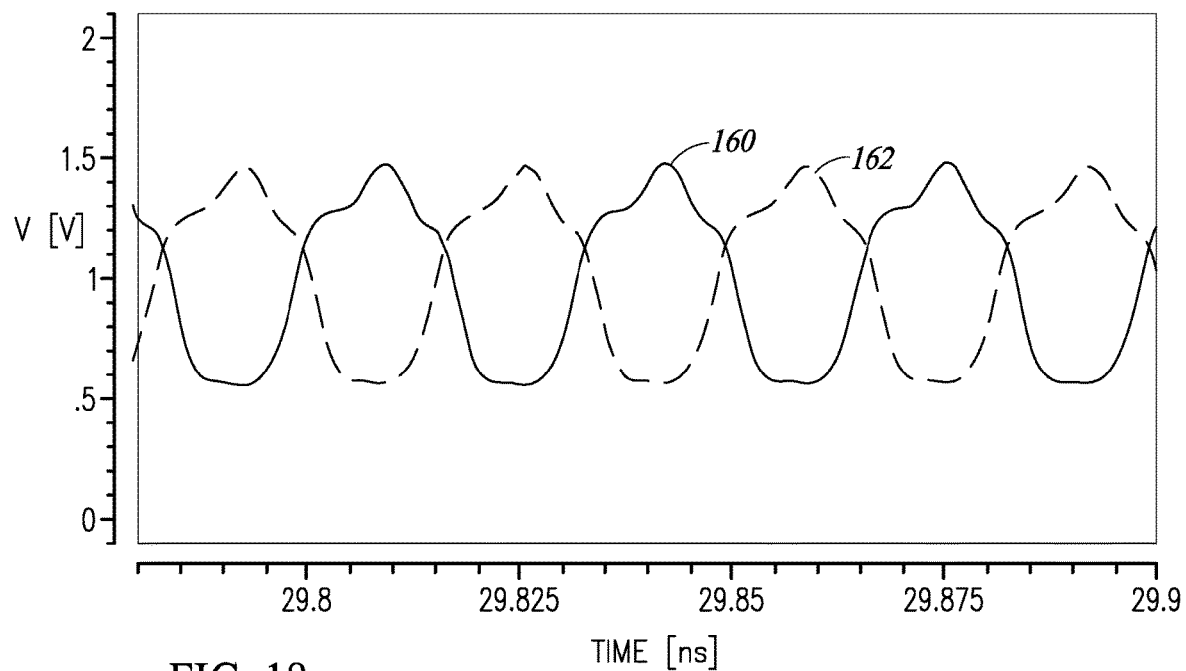
FIG. 18 is a diagram illustrating the oscillator voltage waveform in differential mode.

A diagram illustrating the oscillator voltage waveform in differential mode is shown in FIG. 18 where trace 162 represents the drain voltage $V_{D1}$ on transistor $M_1$ (FIG. 5) and trace 160 represents the drain voltage $V_{D2}$ on transistor $M_2$ which illustrates that the drain voltage contains both fundamental and $5^{th}$ harmonics. Note that the fundamental can be rejected or attenuated for the purpose of boosting the relative importance of the higher harmonic.

Figure 19:
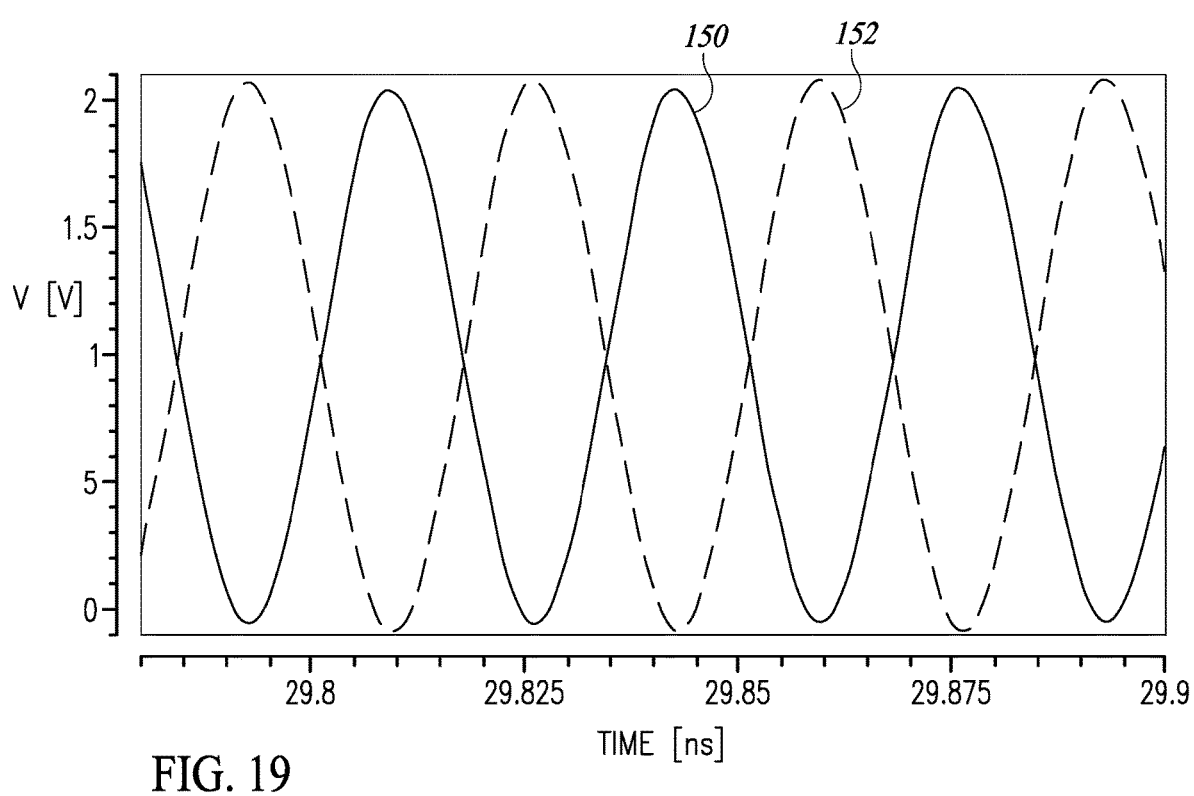
FIG. 19 is a diagram illustrating the oscillator gate voltage waveform.

A diagram illustrating the oscillator gate voltage waveform is shown in FIG. 19 where trace 150 represents the gate voltage $V_{G1}$ on transistor $M_1$ (FIG. 5) and trace 152 represents the gate voltage $V_{G2}$ on transistor $M_2$.

Figure 23:
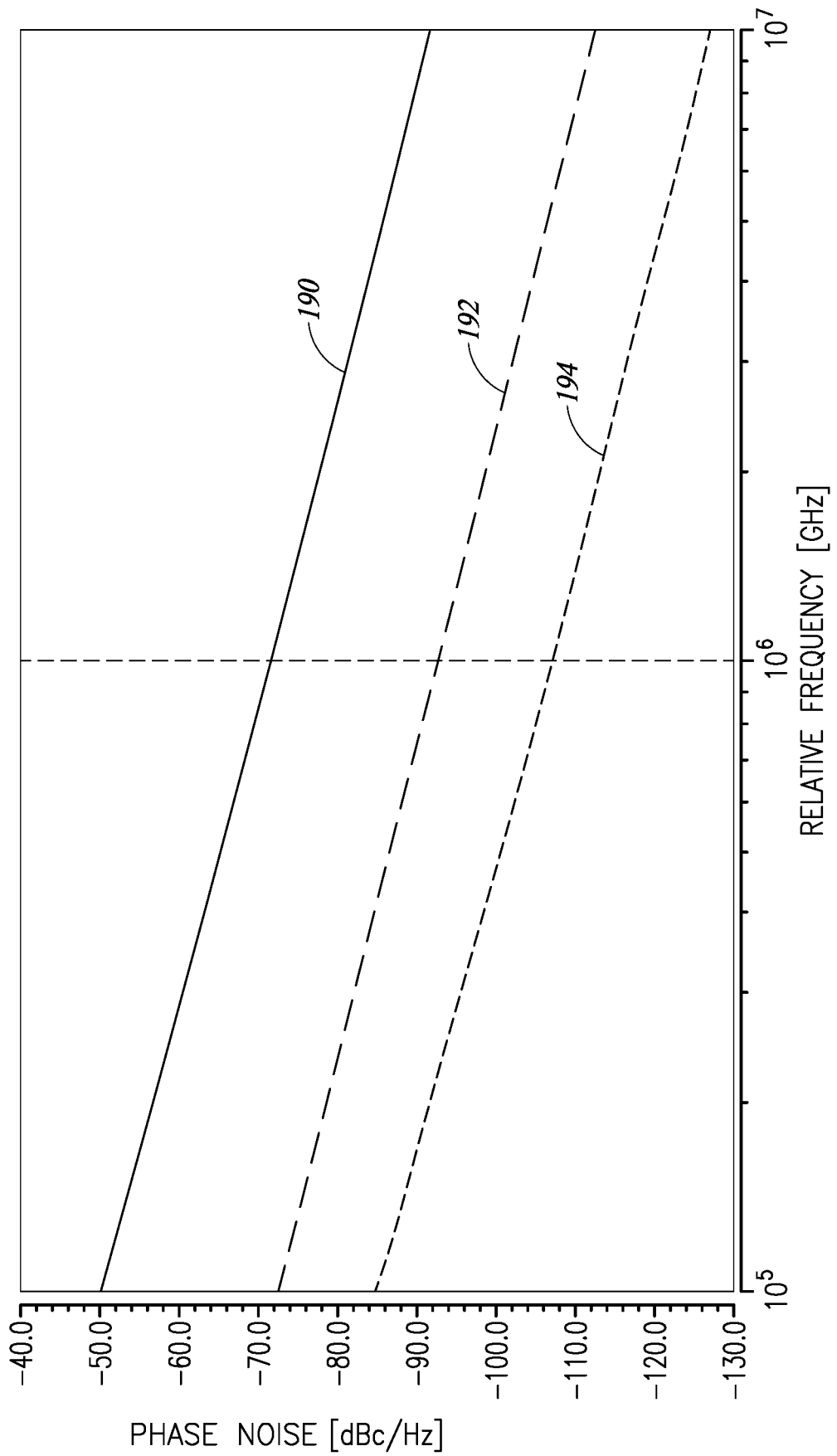
FIG. 23 is a diagram illustrating example phase noise for the oscillator circuit of FIG. 5.

A diagram illustrating example phase noise of the oscillator circuit of FIG. 5 is shown in FIG. 23 where trace 190 represents the phase noise for the high frequency oscillator (e.g., 150 GHz oscillator) 58 (FIG. 5) when it is in free running mode (i.e. not locked); trace 192 represents the phase noise for the high frequency oscillator (e.g., 150 GHz oscillator) 58 when it is locked to the low frequency (e.g., 30 GHz) oscillator 56 whereby its phase noise follows that of the low frequency oscillator; and trace 194 represents the phase noise for the low frequency oscillator (e.g., 30 GHz). As indicated, the phase noise of the oscillator confirms the injection locking theory, therefore the phase noise of the second DCO stage (e.g., the 150 GHz oscillator) follows the phase noise of first DCO stage (e.g., the 30 GHz oscillator).

Figure 24:
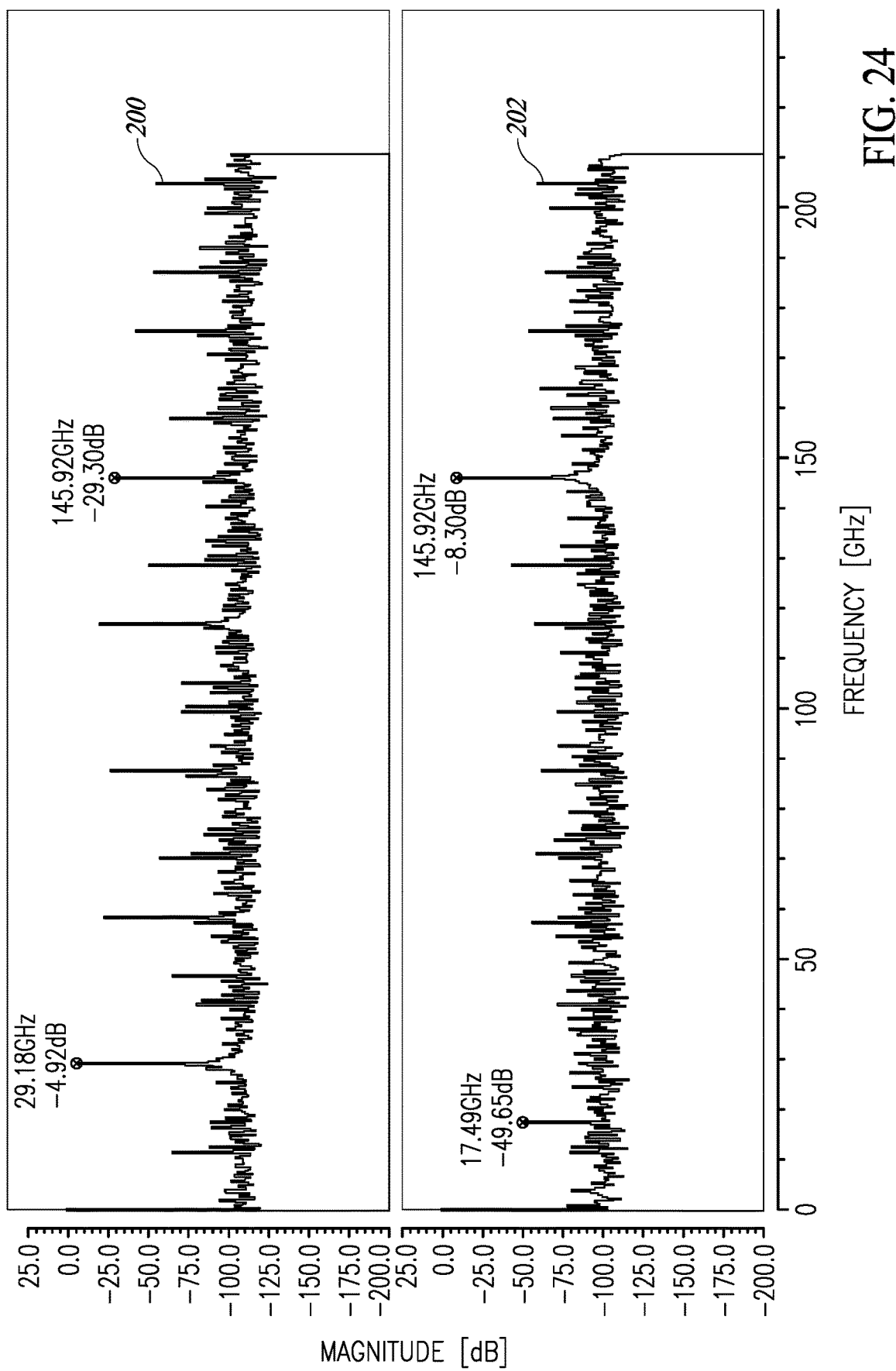
FIG. 24 is a diagram illustrating a first example locked signal spectrum of the oscillator system.
Figure 25:
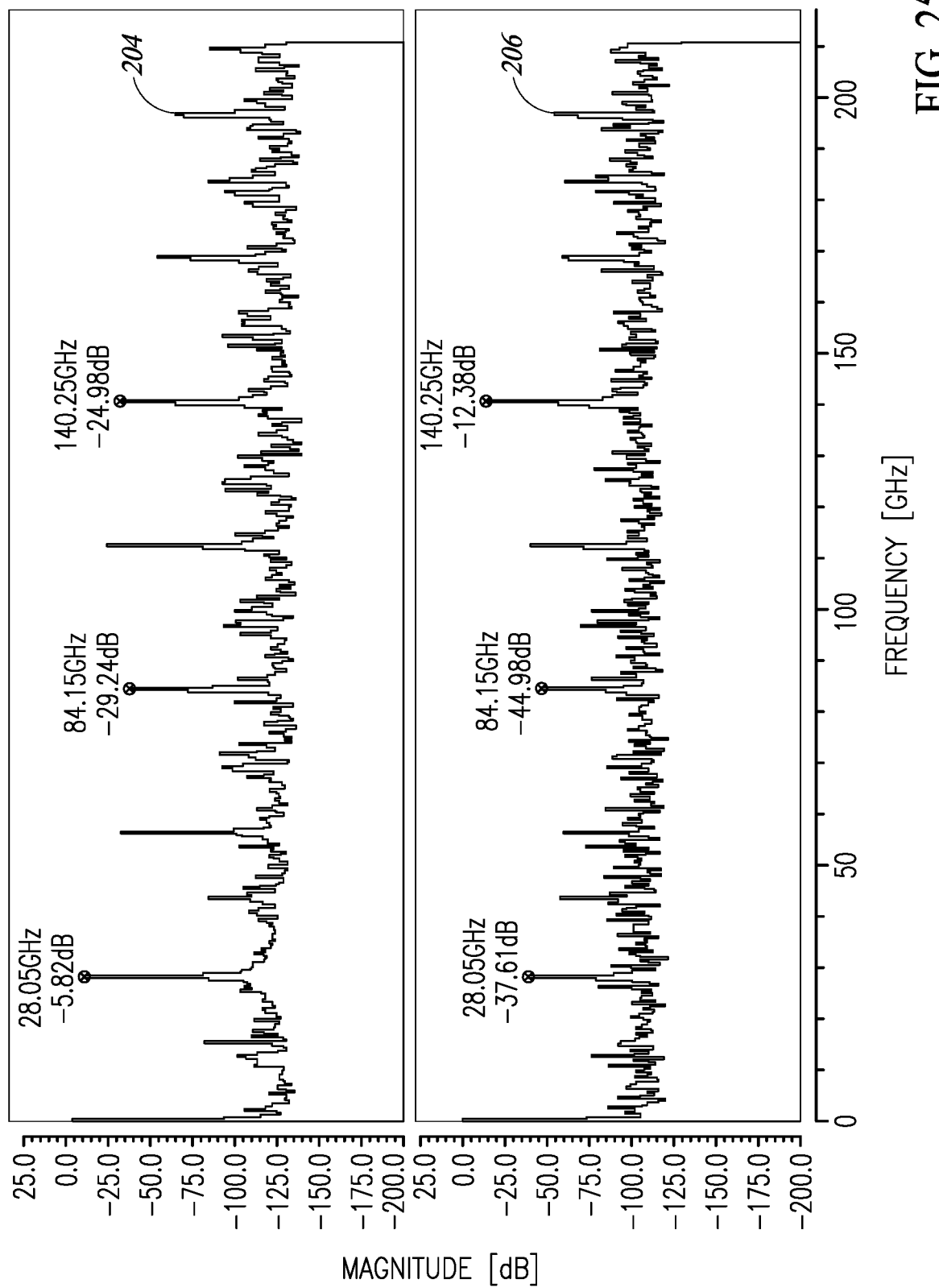
FIG. 25 is a diagram illustrating a second example locked signal spectrum of the oscillator system.

A diagram illustrating a first example locked signal spectrum of the oscillators is shown in FIG. 24 where trace 200 represents the spectrum of the drain voltage of the low frequency DCO and trace 202 represents the drain voltage of the high frequency DCO for a value of $C_s$=284 fF (FIG. 5). A diagram illustrating a second example locked signal spectrum of the oscillators is shown in FIG. 25 where trace 204 represents the spectrum of the drain voltage of the low frequency DCO and trace 204 represents the drain voltage of the high frequency DCO for a value of $C_s$=300 fF (FIG. 5). Note that as the secondary capacitor $C_s$ increases, the oscillator frequency is reduced since the oscillator frequency is a function of one over the square root of LC.

Those skilled in the art will recognize that the boundaries between logic and task blocks are merely illustrative and that alternative embodiments may merge logic or task blocks or impose an alternate decomposition of functionality upon various logic or task blocks. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An oscillator system, comprising:
   a reference frequency pulse generator operative to generate a reference signal containing a plurality of harmonics;
   a first oscillator operative to receive said reference signal output by said pulse generator and to resonate at and generate a first fundamental frequency and one or more harmonic signals therefrom, wherein said first oscillator is injection locked to said pulse generator at one of said plurality of harmonics generated by said pulse generator; and
   a second oscillator operative to receive and resonate at said one of the harmonic signals output by said first oscillator, and to generate an output signal therefrom at a frequency of the one of the harmonic signals output by said first oscillator, wherein said second oscillator is injection locked to said first oscillator at the frequency of the one of the harmonic signals output from said first oscillator.

2. The oscillator system according to claim 1, wherein said reference signal generated by said pulse generator exhibits relatively good phase noise.

3. The oscillator system according to claim 1, wherein said first oscillator's one or more harmonic signals exhibits relatively good phase noise being injection locked to said pulse generator.

4. The oscillator system according to claim 1, wherein said second oscillator normally exhibits relatively bad phase noise but is operative to generate said output signal having relatively good phase noise being injection locked to said first oscillator.

5. The oscillator system according to claim 1, wherein said second oscillator is operative to generate relatively high output power at said output node.

6. The oscillator system according to claim 1, wherein said second oscillator exhibits a relatively wide locking range.

7. An oscillator system, comprising:
   a pulse generator having relatively good phase noise operative to generate a reference frequency signal containing a plurality of harmonics;
   a first oscillator operative to receive said reference frequency signal and to resonate at and generate a millimeter wave output fundamental frequency signal and a higher harmonic signal, wherein said first oscillator is injection locked to said reference frequency signal output of said pulse generator at one of the plurality of harmonics generated by the pulse generator; and a second oscillator having relatively poor phase noise operative to receive the higher harmonic signal, and to generate an output oscillator signal therefrom at a frequency of the higher harmonic signal and at an output node having relatively good phase noise, wherein said second oscillator is injection locked to said first oscillator at the frequency of the higher harmonic signal, wherein the phase noise of said second oscillator tracks that of said first oscillator.

8. The oscillator system according to claim 7, wherein said second oscillator is operative to generate relatively high output power at said output node.

9. The oscillator system according to claim 7, wherein the phase noise of said first oscillator is relatively clean due to the phase noise of said first oscillator tracking that of said pulse generator.

10. The oscillator system according to claim 7, wherein said first oscillator comprises a class F oscillator operative to generate a relatively strong higher harmonic signal.

11. The oscillator system according to claim 7, wherein said second oscillator exhibits a relatively wide locking range.

12. The oscillator system according to claim 7, wherein the higher harmonic signal generated by said first oscillator comprises a fifth harmonic of the output fundamental frequency signal.

13. A method of generating an output oscillator signal, comprising:

generating a reference frequency signal containing a plurality of millimeter wave harmonics;

first injection locking a first oscillator to one of the plurality of millimeter wave harmonics thereby generating a millimeter wave fundamental first oscillator signal and a harmonic thereof, said first oscillator operative to resonate at a frequency of said fundamental first oscillator signal; and second injection locking a second oscillator to the harmonic output of said first oscillator and generating the output oscillator signal therefrom at an output node, said second oscillator operative to resonate at a frequency of said harmonic output of said first oscillator.

14. The method according to claim 13, wherein said reference frequency signal having relatively good phase noise and said second oscillator normally having relatively poor phase noise.

15. The method according to claim 13, wherein the harmonic of the fundamental first oscillator signal generated by said first oscillator comprises a fifth harmonic thereof.

16. The method according to claim 13, further comprising generating the output oscillator signal to have relatively high output power at said output node.

17. The method according to claim 13, further comprising providing said second oscillator with a relatively wide locking range.

18. An oscillator system, comprising:

a pulse generator having relatively good phase noise operative to generate a reference frequency signal having a plurality of harmonics;

a first oscillator operative to receive the reference frequency signal output by said pulse generator and to resonate at and generate a fundamental signal and to also generate a first higher harmonic signal therefrom, wherein said first oscillator is injection locked to a first one of the plurality of harmonics output of said pulse generator;

a second oscillator operative to receive said first higher harmonic signal, to resonate at said first higher harmonic signal, to generate a first output oscillator signal at an output node at a frequency of said first higher harmonic signal, wherein said second oscillator is injection locked to said first oscillator at the frequency of said first higher harmonic signal causing the phase noise of said second oscillator to track that of said first oscillator; and a third oscillator operative to receive said reference signal and to generate a second output signal therefrom at a second higher harmonic frequency, wherein said third oscillator resonating at and injection locked to a second one of the plurality of harmonics output of said pulse generator, wherein the phase noise of said third oscillator tracks the relatively good phase noise of said pulse generator.

19. The oscillator system according to claim 18, further comprising a buffer circuit adapted to receive the signal output of said third oscillator and generate a buffered output signal therefrom.

20. The oscillator system according to claim 18, wherein: said first higher harmonic of said fundamental signal generated by said first oscillator comprises a fifth harmonic thereof; and said second higher harmonic output of said pulse generator comprises a fifth harmonic thereof.

* * * * *